United States Patent
Lu et al.

(10) Patent No.: US 8,045,412 B2
(45) Date of Patent: Oct. 25, 2011

(54) MULTI-STAGE PARALLEL DATA TRANSFER

(75) Inventors: Yong Lu, Edina, MN (US); Harry Hongyue Liu, Maple Grove, MN (US); Hai Li, Eden Prairie, MN (US); Andrew John Carter, Minneapolis, MN (US); Daniel Reed, Maple Plain, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 288 days.

(21) Appl. No.: 12/487,165

(22) Filed: Jun. 18, 2009

(65) Prior Publication Data

US 2010/0097841 A1 Apr. 22, 2010

Related U.S. Application Data

(60) Provisional application No. 61/107,014, filed on Oct. 21, 2008.

(51) Int. Cl.
*G11C 7/00* (2006.01)
(52) U.S. Cl. .......................... 365/219; 365/220; 365/221
(58) Field of Classification Search .................. 365/219, 365/220, 221
See application file for complete search history.

(56) References Cited

U.S. PATENT DOCUMENTS

| | | | |
|---|---|---|---|
| 5,414,820 A | 5/1995 | McFarland et al. | |
| 5,627,976 A | 5/1997 | McFarland et al. | |
| 6,341,085 B1 | 1/2002 | Yamagami et al. | |
| 6,757,842 B2 | 6/2004 | Harari et al. | |
| 6,940,742 B2 | 9/2005 | Yamamura | |
| 7,045,840 B2 | 5/2006 | Tamai et al. | |
| 7,099,179 B2 * | 8/2006 | Rinerson et al. | 365/148 |
| 7,111,142 B2 | 9/2006 | Spencer et al. | |
| 7,362,618 B2 | 4/2008 | Harari et al. | |
| 7,397,713 B2 | 7/2008 | Harari et al. | |
| 7,478,390 B2 | 1/2009 | Brokenshire et al. | |
| 7,542,356 B2 | 6/2009 | Lee et al. | |
| 7,646,629 B2 | 1/2010 | Hamberg et al. | |
| 7,688,620 B2 | 3/2010 | Lee et al. | |
| 7,732,881 B2 | 6/2010 | Wang | |
| 2008/0084725 A1 | 4/2008 | Lahtinen et al. | |
| 2009/0006687 A1 | 1/2009 | Shibata | |
| 2009/0046500 A1 | 2/2009 | Lee et al. | |

OTHER PUBLICATIONS

Non-final Office Action mailed from the USPTO on Sep. 8, 2010 for U.S. Appl. No. 12/352,693.
Response to Non-final Office Action filed in the USPTO on Dec. 8, 2010 for U.S. Appl. No. 12/352,693.
Final Office Action mailed from the USPTO on Jan. 7, 2011 for U.S. Appl. No. 12/352,693.
Response Accompanying Request for Continued Examination after Final Office Action filed in the USPTO on Apr. 1, 2011 for U.S. Appl. No. 12/352,693.

* cited by examiner

*Primary Examiner* — Son Dinh
*Assistant Examiner* — Nam Nguyen
(74) *Attorney, Agent, or Firm* — Fellers, Snider, et al.

(57) ABSTRACT

Apparatus and associated method for transferring data to memory, such as resistive sense memory (RSM). In accordance with some embodiments, input data comprising a sequence of logical states are transferred to a block of memory by concurrently writing a first logical state from the sequence to each of a first plurality of unit cells during a first write step, and concurrently writing a second logical state from the sequence to each of a second non-overlapping plurality of unit cells during a second write step.

20 Claims, 5 Drawing Sheets

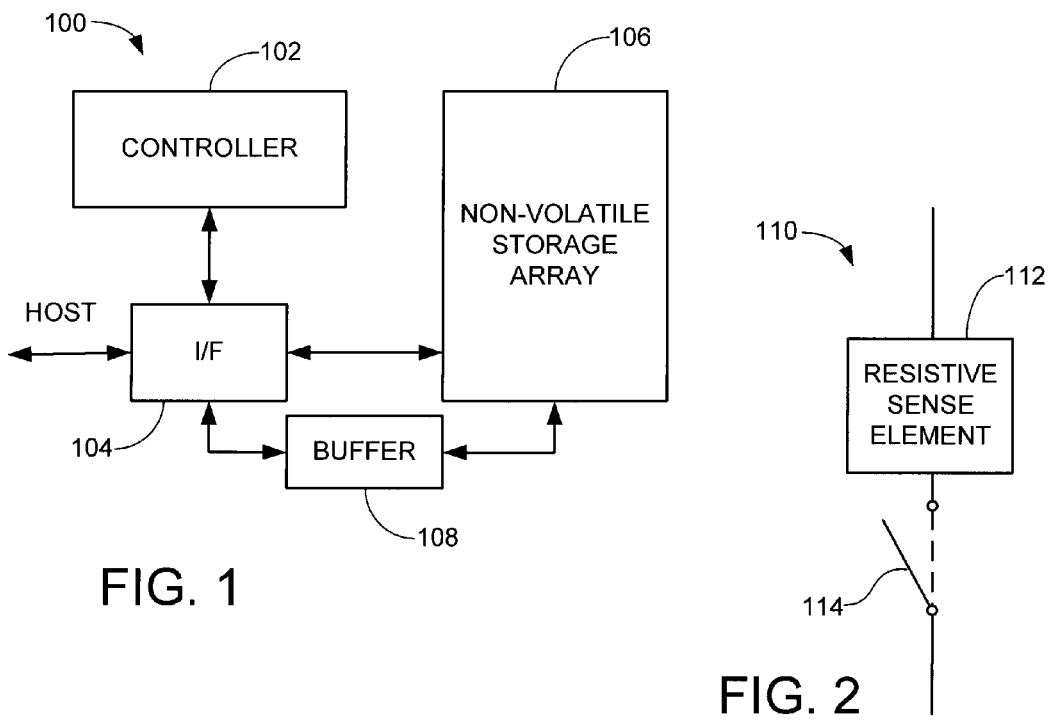
FIG. 1
FIG. 2
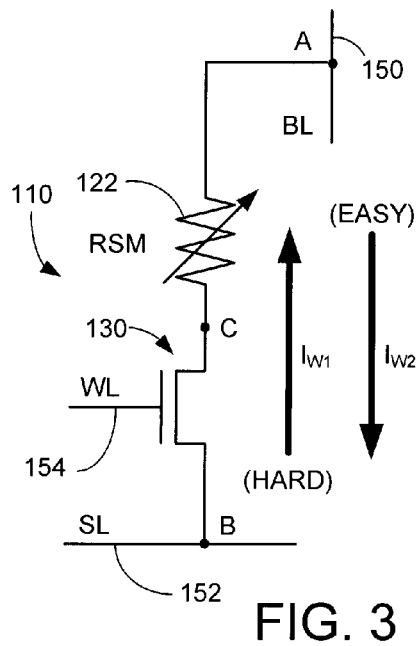
FIG. 3

MULTI-STAGE PARALLEL DATA TRANSFER

RELATED APPLICATIONS

This application makes a claim of domestic priority under 35 U.S.C.§119(e) to U.S. Provisional Patent Application No. 61/107,014 filed Oct. 21, 2008.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

Some memory cells employ resistive sense elements (RSEs), which can be configured to have different electrical resistances to store different logical states. The resistance of the cells can be subsequently detected during a read operation by applying a read current and sensing a signal in relation to a voltage drop across the cell. Without limitation, exemplary types of cells that employ RSEs include resistive random access memory (RRAM), magnetic random access memory (MRAM), and spin-torque transfer random access memory (STTRAM or STRAM).

In these and other types of electronic devices, it is often desirable to increase data transfer performance and areal data density while decreasing power consumption.

SUMMARY

Various embodiments of the present invention are generally directed to an apparatus and associated method transferring data to memory, such as resistive sense memory.

In accordance with some embodiments, the method generally comprises transferring input data comprising a sequence of logical states to a block of memory by concurrently writing a first logical state from the sequence to each of a first plurality of unit cells during a first write step, and concurrently writing a second logical state from the sequence to each of a second non-overlapping plurality of unit cells during a second write step.

In accordance with other embodiments, the apparatus generally comprises a memory array comprising a block of unit cells, and a controller. The controller transfers input data comprising a sequence of logical states to the block of unit cells by concurrently writing a first logical state from the sequence to each of a first plurality of said unit cells during a first write step, and concurrently writing a second logical state from the sequence to each of a second non-overlapping plurality of said unit cells during a second write step.

These and various other features and advantages which characterize the various embodiments of the present invention can be understood in view of the following detailed discussion and the accompanying drawings.

BRIEF DESCRIPTION OF THE DRAWINGS

FIG. 1 generally illustrates a functional block representation of a data storage device.

FIG. 2 generally illustrates a functional block representation of a unit cell.

FIG. 3 graphically illustrates different gate voltage characteristics during different write operations upon the STRAM cell of FIG. 2.

DETAILED DESCRIPTION

Figure 4A:
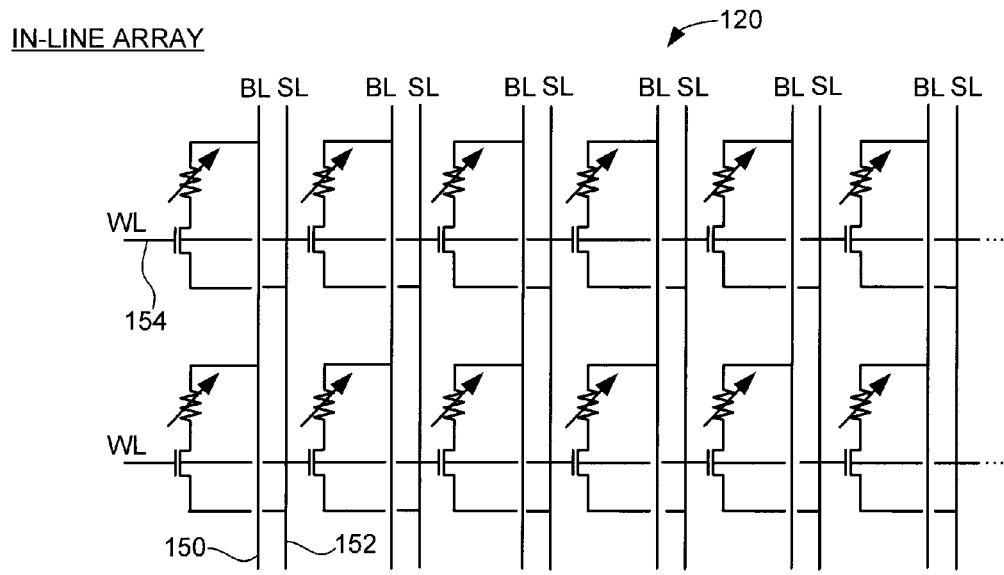
FIG. 4A sets forth an exemplary in-line configuration of a memory array such as set forth in FIG. 1.

FIG. 1 provides a functional block representation of a data storage device 100 constructed and operated in accordance with various embodiments of the present invention. The device 100 includes a top level controller 102, an interface (I/F) circuit 104 and a non-volatile data storage array 106. The I/F circuit 104 operates under the direction of the controller 102 to transfer data between the array 106 and a host device. In some embodiments, a buffer 108 is utilized by the I/F circuit 104 to facilitate transfer of data to/from the array 106.

The array 106 in FIG. 1 can be configured as an array of unit cells 110, such as functionally represented in FIG. 2. The unit cell 110 has a resistive sense element (RSE) 112 connected in series with a switching device 114. The RSE 112 is repetitively programmable to different resistive states, such as a relatively high resistance or a relatively low resistance. The switching device 114 functions to significantly increase the overall resistance of the unit cell 110 when in an open position, and to substantially prevent current from passing through the unit cell 110 when closed.

Advantages of RSE cells over other types of non-volatile memory cells such as EEPROM and flash include the fact that no floating gate is provided in the cell construction. No erase operation is necessary prior to the writing of new data to an existing set of cells. Rather, RSE cells can be individually accessed and written to any desired logical state (e.g., a "0" or "1") irrespective of the existing state of the RSE cell. Also, write and read power consumption requirements are substantially reduced, significantly faster write and read times can be achieved, and substantially no wear degradation is observed as compared to erasable cells, which have a limited write/erase cycle life.

FIG. 3 provides a schematic representation of the RSM cell 110 of FIG. 2. The RSE 122 is depicted as a variable resistor in series with the switching element (transistor) 130. A bit line 150 is coupled to one end of the RSE 122. This connection point is designated as node A. A source line 152 is coupled to the other end of the RSE 122 adjacent the transistor 130 (node B). A third node (node C) is identified between the RSE 122 and the transistor 130. A word line WL 154 is coupled to the gate of the transistor 130 as shown.

The low and high resistance states $R_L$ and $R_H$ are respectively written to the RSE 122 by applying an appropriate voltage to the word line WL 154 to place the switching device 130 into a conductive state, and then passing write currents between the bit line BL 150 and the source line SL 152. Depending on the construction of the RSE 122, the low resistance state $R_L$ may be written by passing a write current from point A to point B (i.e., from BL 150 to SL 152), while the high resistive state $R_H$ may be written by passing a write current in an opposite direction from point B to point A (from SL 152 to BL 150).

To read the programmed state of the RSE 122, the WL 154 is asserted and a read current is passed between the BL 150 and the SL 152. A voltage drop across the cell can be provided via the BL 150 to a sense amplifier, which compares the voltage drop to a suitable reference voltage (not shown). The output state of the sense amplifier will provide a logical bit indicative of the programmed logical state of the RSE.

As will be appreciated by those skilled in the art, RSE based cells such as 110 in FIG. 3 can exhibit asymmetric write current characteristics, in that a relatively higher magnitude of current may be required to program the RSE 122 in one direction as compared to the other. The higher current direction is referred to herein as the "hard direction," and the lower current direction is referred to as the "easy direction".

FIG. 3 shows two respective write currents, $I_{W1}$ and $I_{W2}$. The first write current $I_{W1}$ denotes a write operation in the hard direction. The $I_{W1}$ current passes from the source line SL 152 and across the drain-source junction of the transistor 130 prior to reaching the RSE 122. The second write current $I_{W2}$ represents a write operation in the easy direction. The $I_{W2}$ current passes immediately from the bit line BL 150 to the RSE 122, and then through the drain-source junction of the transistor 130 to the source line SL 152.

In various embodiments of the present invention, the RSE 122 can be a magnetic tunneling junction (MTJ). One reason for such write current asymmetries is the forward bias voltage drop of the transistor 130. This forward bias voltage drop is upstream of the RSE 122 in the hard direction, but downstream of the RSE 122 in the easy direction. A higher driving voltage may need to be applied during a hard write as compared to during an easy write to provide the same voltage drop across the RSE 122.

FIG. 4A provides an exemplary schematic representation of a portion of an array of unit cells 120 arranged as an in-line array. The source lines SL 152 are arranged to be substantially in-line, or parallel with the bit lines BL 150. The word lines WL 154 are substantially perpendicular to the BLs 150 and SLs 152.

Figure 4B:
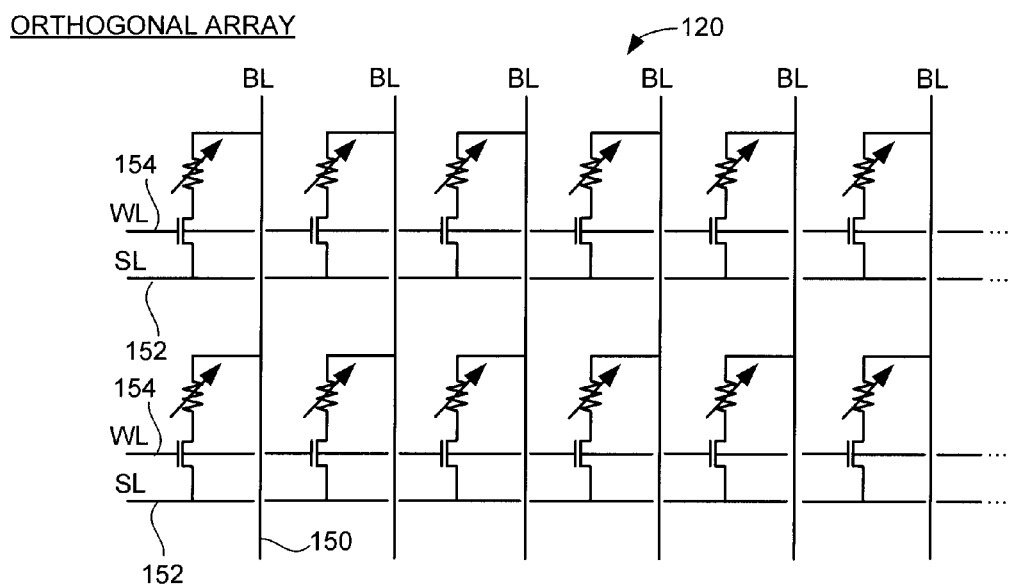
FIG. 4B sets forth an exemplary orthogonal configuration of a memory array such as set forth in FIG. 1.

FIG. 4B provides an alternative schematic representation of an array of resistive sense memory (RSM) cells 120 arranged as an orthogonal array. The source lines SL 152 are substantially orthogonal, or perpendicular to the bit lines BL 150. The word lines WL 154 are substantially parallel to the source lines SL 152, and substantially perpendicular to the bit lines BL 150.

Figure 4C:
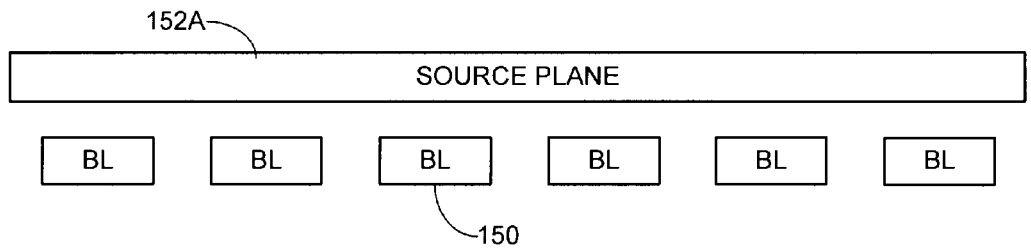
FIG. 4C generally illustrates the use of a source plane with the orthogonal configuration of FIG. 5B.

Orthogonal array configurations such as FIG. 4B can be more efficient from a density standpoint as compared to in-line array configurations such as FIG. 4A. Further efficiencies may be gained when the source lines SL 152 are connected together to form a contiguous source plane 152A, as generally represented in FIG. 4C. It will be appreciated that the source plane 152A in FIG. 4C is merely illustrative in nature; the placement and ordering of the respective layers in an actual semiconductor layout may vary depending on the requirements of a given application.

While advantageously increasing data density, the use of source planes such as 152A can provide relatively high parasitic capacitances during write operations, particularly when writing alternating low and high resistance states to a number of cells in the array. This can undesirably increase precharge power consumption levels and reduce data transfer rates in the device.

Accordingly, various embodiments of the present invention provide a novel structure and technique for transferring input data into a memory array. Input data comprising a selected multi-bit logical sequence are transferred to the array by concurrently writing a first logical state from the sequence to each of a first set of unit cells during a first write step, and concurrently writing a second logical state from the sequence to each of a non-overlapping second set of unit cells during a second write step.

In some embodiments the first write step results in the concurrent writing of all of the logical 0s from the input sequence, followed by the concurrent writing of the logical 1s from the input sequence during a second write step. In other embodiments, the logical states may correspond to multi-bit values, so that all of the occurrences of a given multi-bit value, such as 01, are written during one step, and all of the respective occurrences of the remaining values 10, 11 and 00 are respectively written during other steps. Further in some embodiments, the RSM cells 120 can consist of spin torque transfer random access memory (STRAM).

The non-overlapping nature of the multiple step write results in each corresponding unit cell in the array being only written once during the write operation. This is in contrast to erase operations where all of the cells are previously written to an initial logical value, such as logical 1. During a subsequent write, a different logical value, such as logical 0, is overwritten in the appropriate locations as necessary to store the input sequence.

The ability to write particular logical states precisely to a number of memory cells concurrently provides advantageous operational efficiency due to the elimination of redundant bit writing. Furthermore, power consumption is improved as control line drivers can provide access to large numbers of memory cells in a single direction write pulse, as opposed to multiple individual pulses in opposing directions.

Figure 5:
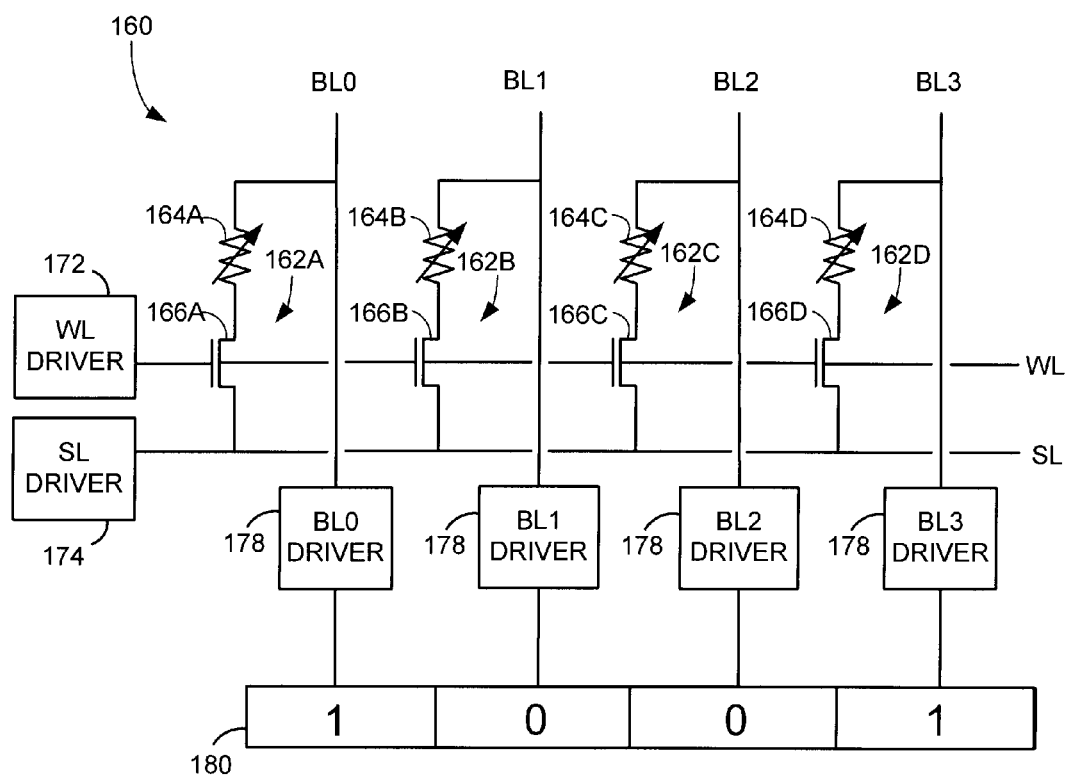
FIG. 5 is a schematic representation of circuitry capable of performing a dual stage parallel data transfer in accordance with various embodiments of the present invention.

A simplified exemplary embodiment is set forth by FIG. 5 to explain the foregoing features and advantages. FIG. 5 illustrates a block 160 of memory cells comprising RSE cells arranged into a semiconductor array. More specifically, FIG. 4 illustrates four RSM cells denoted 162A-162D, each having an associated RSE 164A-D and switching device (transistor) 166A-D. A plurality of control lines are shown in FIG. 5 to include multiple bit lines BL0-BL3, a single source line SL and a single word line WL. Although not limiting, it is contemplated that the array in FIG. 5 is an orthogonal array, and the source line SL constitutes a source plane (such as 152A in FIG. 4C).

While FIG. 5 shows the block 160 to comprise four cells, it will be appreciated that this is merely for purposes of illustration. Any size of block can be used; while addressable blocks will often utilize a number of blocks equal to a power of two (e.g., 16 bits, 64 bits, etc.), such is not necessarily required. In some embodiments, the block 160 can correspond to a page in memory, and can be extended to include any number of columns and rows of cells.

The cells share a common word line WL and source line SL that are respectively engaged by a word line driver 172 and source line driver 174. Each bit line has an individual bit line driver 178. One practical advantage of orienting a number of memory cells as shown in FIG. 5 is the ability to control multiple cells with a minimal number of drivers, thereby promoting efficient power consumption and fast cell access.

The independent bit line drivers 178 assigned to each cell allows for the writing of logical states (in this case, individual bits of 1s and 0s) to a cell without affecting adjacent cells. For example, an input sequence of logical states can be transferred to a buffer 180 to be written to the respective cells by the individual bit line drivers 178. The circuitry of FIG. 5 can thus be characterized as carrying out a serial load, two-stage parallel write to non-overlapping cells.

To write the logical 1s in the input sequence in the buffer 180 to the block 160, the BL0 and BL3 drivers can be coupled to a suitable reference level (such as ground), the BL1 and BL2 drivers can be placed in a high impedance state, the WL driver can assert the WL, and the SL driver can apply an appropriate write current pulse to the SL. The write current pulse will operate to concurrently write the respective logical 1s to the associated cells.

To write the logical 0s in the input sequence in the buffer 180, the WL driver can assert the WL, the SL driver can couple the SL to the reference level, and current pulses can be concurrently applied by the BL1 and BL2 drivers. As desired, the active drivers can comprise switches that distribute a single pulse from an upstream source to the appropriate bit lines to concurrently write the 0s to the appropriate cells.

In this way, the writing of all the logical states to the block of memory can be facilitated through two concurrent write operations that involve minimal power, time, and complexity. The non-overlapping nature of the respective write steps prevents excess power consumption and improves data transfer rates. Optionally, the written data can be subsequently read from the block using a data read back technique.

In some embodiments, cells with asymmetric write currents are used. The embodiment shown in FIG. 5 allows for efficient asymmetric cell compensation through various methods such as, but not limited to, elevating the word line voltage being received by selected switching devices. The word line driver 172 can be configured to boost the voltage sent through the word line in a precharging operation by connecting a voltage boosting circuitry.

Compensation for asymmetric write currents can further be provided by tailoring the magnitudes and durations of the respective write currents to appropriate levels. Longer duration current pulses in the hard direction can be tolerated since all of the logical states for that direction are being concurrently written, rather than serially.

The buffer 180 can take any suitable configuration and is not limited to a particular memory or location. Thus, without limitation the buffer 180 can comprise a volatile register or a non-volatile cache. Data can be loaded to the buffer 180 in serial or parallel fashion.

Figure 6A:
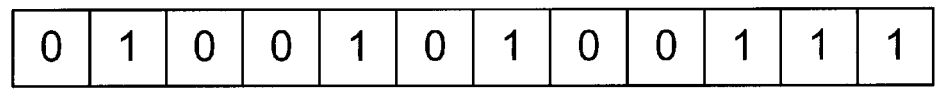
FIGS. 6A-6C are functional representations of a dual stage parallel data transfer performed in accordance with various embodiments of the present invention.
Figure 6B:
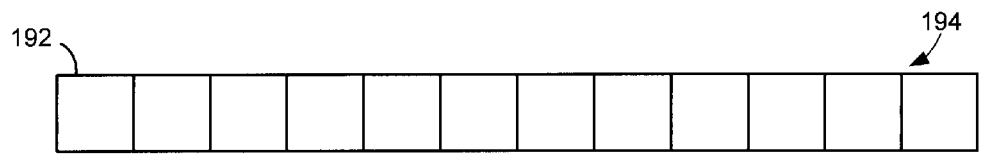
Figure 6C:
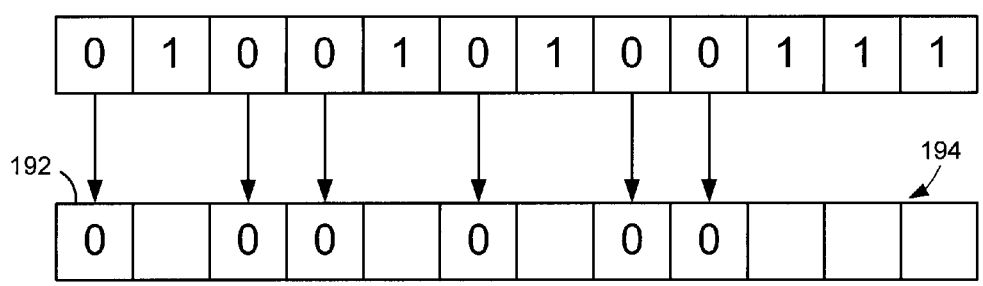

FIGS. 6A-6C illustrate exemplary input data transfers in accordance with further embodiments of the present invention. A sequence of logical states are loaded to a buffer 190 that has a capacity equal to the number of cells 192 in a block (page) of memory 194. It should be noted that the number of logical states, size of the buffer, and size of the page of memory are not limited and can be different amounts from that shown in FIG. 6A. As before, the buffer 190 receives the input data in preparation for the write operation, which does not initiate until the buffer is filled.

FIG. 6B shows a first write operation that concurrently transfers the 0s from the buffer 190 to the page of memory 194. FIG. 6C shows a second write operation that concurrently transfers the 1s from the buffer 190 to the page of memory. It will be appreciated that other sequencing can be provided. For example, the logical 1s can be written prior to the logical 0s. Multi-bit logical values (e.g., 00, 01, 10 and 11) in the input sequence can be concurrently written to individual cells during respective steps. The concurrent writing of common logical states compensates for parasitic capacitances and other effects to reduce precharging power consumption and elapsed time.

It should be noted that the buffer 190 can conduct write operations on a number of different pages of memory either individually or collectively. Hence, the sets of logical states can be concurrently mirrored to cells of several pages of memory by engaging the respective word and source line drivers.

Figure 7:
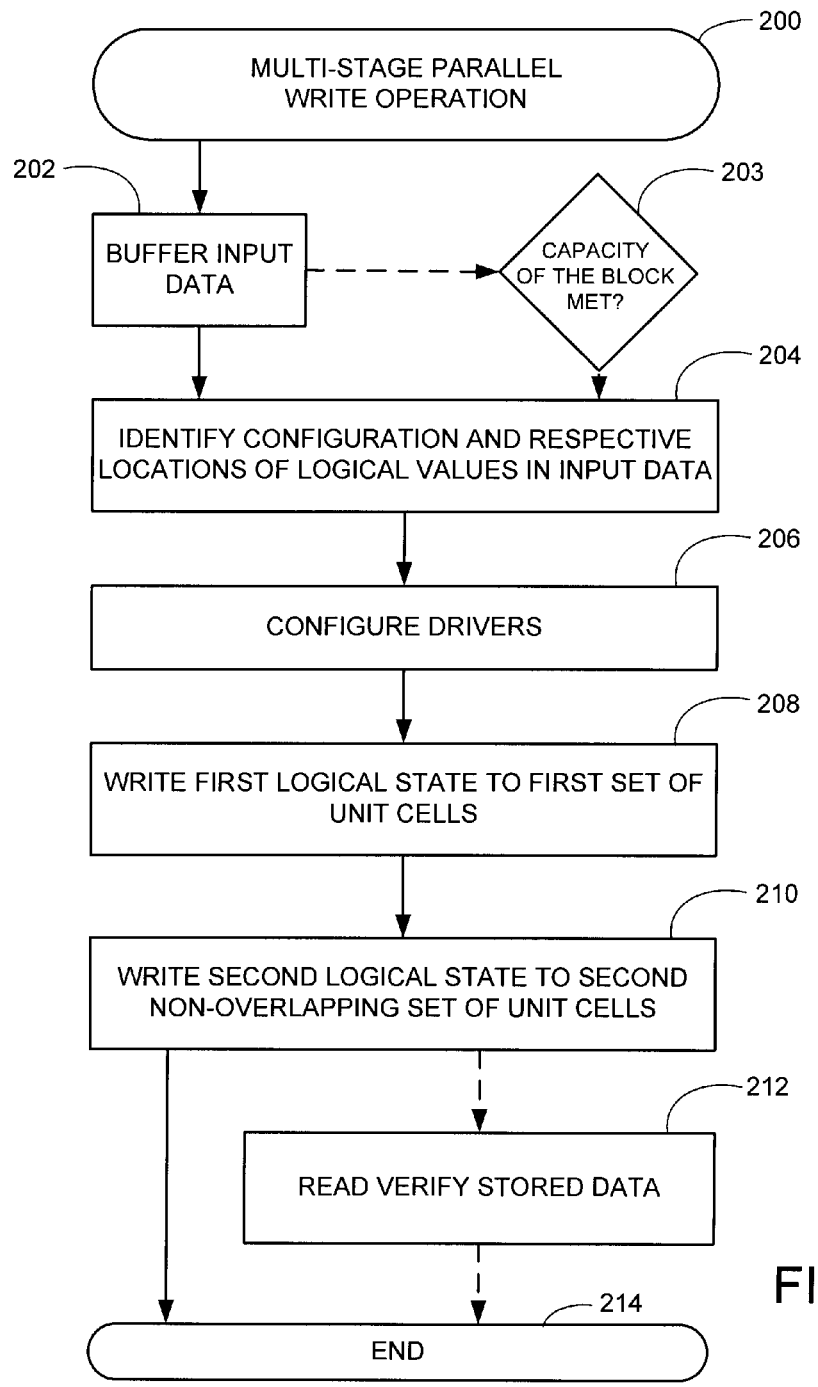
FIG. 7 is a flow chart for asymmetric write compensation generally illustrative of steps carried out in accordance with various embodiments of the present invention.

FIG. 7 provides a flow chart for a multi-stage parallel write operation 200 to summarize the foregoing discussion. It is contemplated that the various steps of FIG. 7 are carried out under the direction of a device controller, such as the controller 102 in FIG. 1.

At step 202, a buffer stores input data. In some embodiments, the buffer load operation continues until the capacity of the destination block of memory is met, as displayed in decision 203. The data capacity of the buffer can be equal to or larger than the number of cells in the block of memory to which the data will be written.

At step 204, the configuration and respective locations of logical values in the input data are identified. In the present example, it is contemplated that a single bit is written to each cell, so the respective logical states will be identified as the logical 0s and logical 1s. A high speed logical operation, such as an exclusive-or (XOR) operation, can be carried out on the buffered data to identify the respective locations of the respective logical states in the input sequence.

The output of the logical operation can be used to configure the appropriate drivers, as shown by step 206. This configuration can take into account write current asymmetry effects. As desired, the respective write current profiles can be adaptively adjusted in relation to the respective numbers of logical values to be written during each step. For example, concurrently writing the logical 1s in the sequence 11111011 might be found to require a larger current magnitude, voltage and/or duration as compared to concurrently writing the logical 1s in the sequence 00000100.

At step 208, a first logical state is concurrently written to a first set of unit cells (such as all of the logical 0s), and a second logical state is concurrently written to a non-overlapping second set of unit cells at step 210. Although not shown in the routine of FIG. 8, further write steps are successively carried out for additional logical states. In some embodiments, a write verify operation is optionally denoted at step 212, after which the routine ends at step 214.

Although various embodiments set forth above generally identify the hard and easy directions based on the relative sequential ordering of a resistive sense element and a switching device of a cell, such is not necessarily limiting. Rather, it is contemplated that various memory cell constructions may alternatively have an "easy" and a "hard" direction based on some other feature of the cell. It will be understood that the various embodiments disclosed herein are equally suitable for these other types of memory cells in obtaining read current symmetry without compromising cell reliability.

As can be appreciated by one skilled in the art, the various embodiments illustrated herein provide advantageous writing of data to a memory cell in a fast and reliable manner. The ability to fill a block of memory with the respective writing of multiple non-overlapping sets of logical states allows for consistent data writing with reduced power consumption and reduced elapsed write time. Compensation for various effects such as parasitic capacitance and write current asymmetry can be readily provided. The multi-step concurrent writing also facilitates the use of smaller cell sizes, which promotes higher array data densities. It will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising a step of transferring input data comprising a sequence of logical states to a block of memory by concurrently writing a first logical state from the sequence to each of a first plurality of unit cells during a first write step, and concurrently writing a second logical state from the sequence to each of a second non-overlapping plurality of unit cells during a second write step.

2. The method of claim 1, wherein the first logical state comprises a logical 0, and wherein the second logical state comprises a logical 1.

3. The method of claim 1, wherein each of the first and second logical states comprises a different multi-bit value.

4. The method of claim 1, further comprising the step of loading the input data to a buffer connected to the block of memory.

5. The method of claim 4, further comprising the step of identifying the respective configurations and locations of the respective first and second logical states.

6. The method of claim 1, further comprising performing a read verify operation upon the respective first and second pluralities of unit cells after the first and second write steps.

7. The method of claim 1, wherein the block of memory is characterized as comprising an orthogonal array configuration with a plurality of bit lines coupled to said unit cells and a plurality of source lines coupled to said unit cells, wherein the bit lines are substantially perpendicular to the source lines, wherein write currents pass through each of the first plurality of unit cells during the first write step in a first direction between the bit lines and the source lines, and wherein write currents pass through each of the second non-overlapping plurality of unit cells during the second write step in an opposing second direction between the bit lines and the source lines.

8. The method of claim 1, wherein the block of memory is characterized as comprising an orthogonal array configuration with a plurality of bit lines coupled to said unit cells and a contiguous source plane coupled to said unit cells, wherein write currents pass through each of the first plurality of unit cells during the first write step in a first direction between the bit lines and the source plane, and wherein write currents pass through each of the second non-overlapping plurality of unit cells during the second write step in an opposing second direction between the bit lines and the source plane.

9. The method of claim 1, wherein the respective first and second pluralities of unit cells written during the respective first and second write steps are written by the application of respective first and second write pulses, the first and second write pulses having different magnitudes selected in relation to the respective numbers of unit cells in said first and second pluralities.

10. The method of claim 1, further comprising applying an exclusive-or (XOR) logical operation to buffered data to identify the respective first and second pluralities of unit cells.

11. An apparatus comprising:
a memory array comprising a block of unit cells; and
a controller which transfers input data comprising a sequence of logical states to the block of unit cells by concurrently writing a first logical state from the sequence to each of a first plurality of the unit cells during a first write step, and concurrently writing a second logical state from the sequence to each of a second plurality of the unit cells during a second write step, wherein the first plurality and second plurality of unit cells are mutually exclusive.

12. The apparatus of claim 11, wherein the first logical state comprises a logical 0, and wherein the second logical state comprises a logical 1.

13. The apparatus of claim 11, wherein each of the first and second logical states comprises a multi-bit value.

14. The apparatus of claim 11, further comprising a first driver which generates a single, first write pulse which is concurrently applied across the first plurality of unit cells to write the first logical state thereto, and wherein the apparatus further comprises a second driver which generates a single, second write pulse which is concurrently applied across the second plurality of unit cells to write the second logical state thereto, the first and second write pulses having different respective magnitudes selected in relation to the respective numbers of unit cells in said first and second pluralities of unit cells.

15. The apparatus of claim 11, wherein the block of memory is characterized as comprising an orthogonal array configuration with a plurality of bit lines coupled to said unit cells and a plurality of source lines coupled to said unit cells, wherein the bit lines are substantially perpendicular to the source lines, wherein write currents pass through each of the first plurality of unit cells during the first write step in a first direction between the bit lines and the source lines, and wherein write currents pass through each of the second non-overlapping plurality of unit cells during the second write step in an opposing second direction between the bit lines and the source lines.

16. The apparatus of claim 11, wherein the block of memory is characterized as comprising an orthogonal array configuration with a plurality of bit lines coupled to said unit cells and a contiguous source plane coupled to said unit cells, wherein write currents pass through each of the first plurality of unit cells during the first write step in a first direction between the bit lines and the source plane, and wherein write currents pass through each of the second non-overlapping plurality of unit cells during the second write step in an opposing second direction between the bit lines and the source plane.

17. The apparatus of claim 11, wherein a selected one of the first or second plurality of unit cells is written in a hard direction and a remaining one of the first or second plurality of unit cells is written in an easy direction.

18. The apparatus of claim 17, wherein the unit cells are RSM cells comprise spin torque transfer random access memory (STRAM) cells.

19. An apparatus comprising a memory array comprising a block of unit cells and a controller which transfers input data comprising a sequence of logical states into a buffer adjacent the block of unit cells by concurrently writing a first logical state from the sequence to each of a first plurality of the unit cells during a first write step, and concurrently writing a second logical state from the sequence to each of a second plurality of the unit cells during a second write step, wherein the first plurality and second plurality of unit cells are mutually exclusive, and wherein the controller identifies the respective configurations and locations of the respective first and second logical states in the loaded sequence.

20. The apparatus of claim 19, wherein the buffer is a cache comprising non-volatile memory.

* * * * *